United States Patent
Kao et al.

(10) Patent No.: US 8,580,117 B2
(45) Date of Patent: Nov. 12, 2013

(54) SYSTEM AND METHOD FOR REPLACING RESIST FILTER TO REDUCE RESIST FILTER-INDUCED WAFER DEFECTS

(75) Inventors: Yao-Hwan Kao, Hsinchu County (TW); Po-Chang Huang, Taipei (TW)

(73) Assignee: Taiwan Semiconductor Manufactuing Company, Ltd., Hsin-Chu (TW)

( * ) Notice: Subject to any disclaimer, the term of this patent is extended or adjusted under 35 U.S.C. 154(b) by 1445 days.

(21) Appl. No.: 11/688,530

(22) Filed: Mar. 20, 2007

(65) Prior Publication Data

US 2008/0230492 A1 Sep. 25, 2008

(51) Int. Cl.
*B01D 29/96* (2006.01)
*B01D 35/157* (2006.01)

(52) U.S. Cl.
USPC ........... 210/636; 210/791; 210/777; 210/141; 210/418

(58) Field of Classification Search
USPC ........... 210/777, 791, 651, 650, 797, 141, 88, 210/106, 134, 135, 143, 418, 420, 424, 210/636; 118/600, 603, 610
See application file for complete search history.

(56) References Cited

U.S. PATENT DOCUMENTS

| | | | | |
|---|---|---|---|---|
| 4,601,409 A | * | 7/1986 | DiRegolo | 222/1 |
| 5,507,959 A | * | 4/1996 | Glick | 210/797 |
| 5,820,689 A | * | 10/1998 | Tseng et al. | 134/3 |
| 5,858,106 A | | 1/1999 | Ohmi et al. | |
| 6,106,722 A | * | 8/2000 | Chew et al. | 210/651 |
| 6,336,960 B1 | * | 1/2002 | Marinaro et al. | 95/266 |
| 6,457,480 B1 | * | 10/2002 | Cotte et al. | 134/22.1 |
| 6,503,568 B1 | | 1/2003 | Oota et al. | |
| 6,712,956 B2 | * | 3/2004 | Kim | 210/87 |
| 7,156,948 B2 | * | 1/2007 | Lin et al. | 156/345.18 |

* cited by examiner

*Primary Examiner* — David C Mellon
(74) *Attorney, Agent, or Firm* — Haynes and Boone, LLP

(57) ABSTRACT

System and method for replacing a resist filter in such a manner as to reduce filter-induced wafer defects are described. In one embodiment, the system comprises a filtration system connected to a dispenser, the filtration system comprising a filter; and a switch connected to the filter for selectively connecting the filtration system to throughput one of a first chemical solution and a second chemical solution.

5 Claims, 2 Drawing Sheets

SYSTEM AND METHOD FOR REPLACING RESIST FILTER TO REDUCE RESIST FILTER-INDUCED WAFER DEFECTS

BACKGROUND

In photolithography processes, a photoresist coating system (or "coater") is connected a chemical supply via one or more conduits, such as pipes, and a filtration system. The filtration system generally includes a filter comprising porous media for filtering particles and other contaminates from the chemical solution, such as photoresist, being supplied to the coater. When a new filter is installed in the filtration system, the chemical solution is used to clean, or flush out, the system, including the conduit and the filter itself. Clearly, this is an expensive process, as the chemical solution itself is expensive and more than two liters of solution is required to accomplish this process. As an alternative, a less expensive chemical solution, or solvent, may be used to clean, or "pre-wet", the filter off-line, after which the pre-wet filter is installed in the system. Once the filter installed, the system is cleaned using the more expensive chemical solution to flush the filter and tube.

The benefits of employing resist filters as described above include a reduction in operating costs resulting from the extension of the life of the stripping solution, an increase in overall yield as a result of the decrease in the resist carry-through and reduction in downtime, and a decrease in effluent plant demand. In a typical scenario, when a new filter needs to be installed in a tool, the filter is installed in and manually pre-wet at an off-line dummy. Upon completion of the pre-wetting process, the filter is uninstalled from the off-line dummy and installed in the required tool.

Unfortunately, the use of resist filters as described above can induce wafer defects. One such defect may result from insufficient filter pre-wetting, causing a bubble inside the filter that may induce a bridge defect. Another cause of such defects is poor filter quality, in which case a contaminating particle may originate from the filter itself. Yet another cause of such defects is the use of filters whose useful lifetimes are close to expiring or have expired. Additionally, there is a risk of filter contamination each time the filter is installed in and uninstalled from the off-line dummy and the actual tool.

BRIEF DESCRIPTION OF THE DRAWINGS

The features and advantages of a system and method for reducing resist filter-induced wafer defects in accordance with an embodiment will be more clearly understood from the following description taken in conjunction with the accompanying drawings in which like reference numerals designate similar or corresponding elements, regions, and portions, and in which.

DETAILED DESCRIPTION

Figure 1:
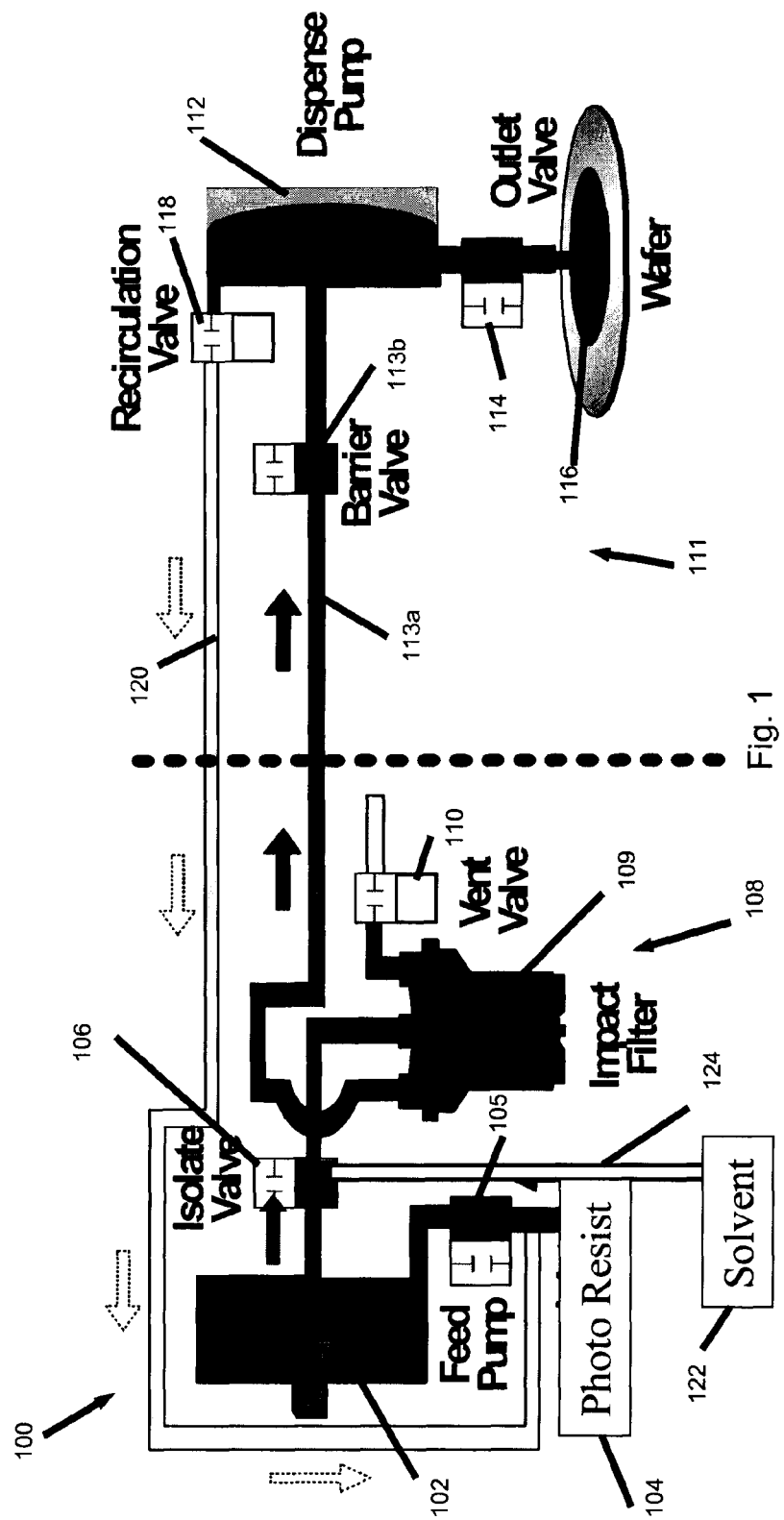
FIG. 1 illustrates a system in which is a resist filter replacement technique in accordance with one embodiment is implemented.

FIG. 1 illustrates a system 100 in which a resist filter replacement technique in accordance with one embodiment is implemented. As shown in FIG. 1, the system 100 comprises a feed pump 102 connected to a supply 104 via a valve 105. During normal operation of the system 100, the feed pump 102 pumps a chemical solution from the supply 104 into the feed pump through the valve 105. In one embodiment, the chemical solution from the supply 104 comprises photoresist. The feed pump 102 further pumps the photoresist through a two-inlet isolation valve 106 and into a filtration system 108, which comprises a replaceable filter 109 and a vent valve 110. The filtered photoresist is then provided to a coater portion 111 of the system comprising a dispense pump 112 via a pipe 113a and barrier valve 113b. The dispense pump 112 dispenses the filtered photoresist via an outlet valve 114 to coat a wafer 116 disposed thereunder in a conventional fashion. Unused photoresist is recirculated from the dispense pump 112 back to the feed pump 102 via a recirculation valve 118 and pipe 120.

In accordance with features of one embodiment, a second supply 122 is provided containing a second chemical solution, which solution is preferably less expensive than the chemical solution in the supply 104. In one embodiment, the second chemical solution is an organic solvent capable of dissolving the first chemical solution. The supply 122 is connected to a second inlet of the two-inlet isolation valve 106 via a pipe 124 for purposes that will be described in greater detail below. It will be recognized that the two-inlet isolation valve 106 functions as a switch mechanism, controlling whether solution from the first supply 104 or the second supply 122 is pumped through the filtration system 108. It will also be recognized that the valve 106 may be implemented using any element that is capable of performing the switching functions described herein.

As previously described, during normal operation, the supply 104 is connected to the filtration system 108, such that photoresist is pumped from the supply 104, filtered by the filtration system, and then provided to the dispense pump 112 for use in coating wafers, such as the wafer 116, in a conventional fashion. In accordance with features of one embodiment, when the filter 109 of the filtration system 108 needs to be replaced, rather than pre-wetting the replacement filter offline, the replacement filter is installed directly in the filtration system 108, at which point the two-inlet isolation valve 106 is positioned such that the supply 122 is connected to the filtration system 108. In this manner, solvent from the supply 122, rather than photoresist from the supply 104, is used to clean and pre1wet the filter 108 and to flush out the system 100, including the pipes 113a, 120, 124, filtration system 108, and dispense pump 112. Typically, more than two liters of fluid is required to complete the flushing process. After the system 100 has been flushed using the solvent, photoresist is pumped from the supply 104 and used to purge the solvent from the system 100 and to fill the pipes 113a, 120, with photoresist.

In this manner, a less expensive solution, such as an organic solvent, can be used to flush contaminates from a replacement filter and system pipes while the filter is in situ in the filtration system 108, thereby reducing the possibility that the filter will be contaminated as a result of excessive handling thereof.

Figure 2:
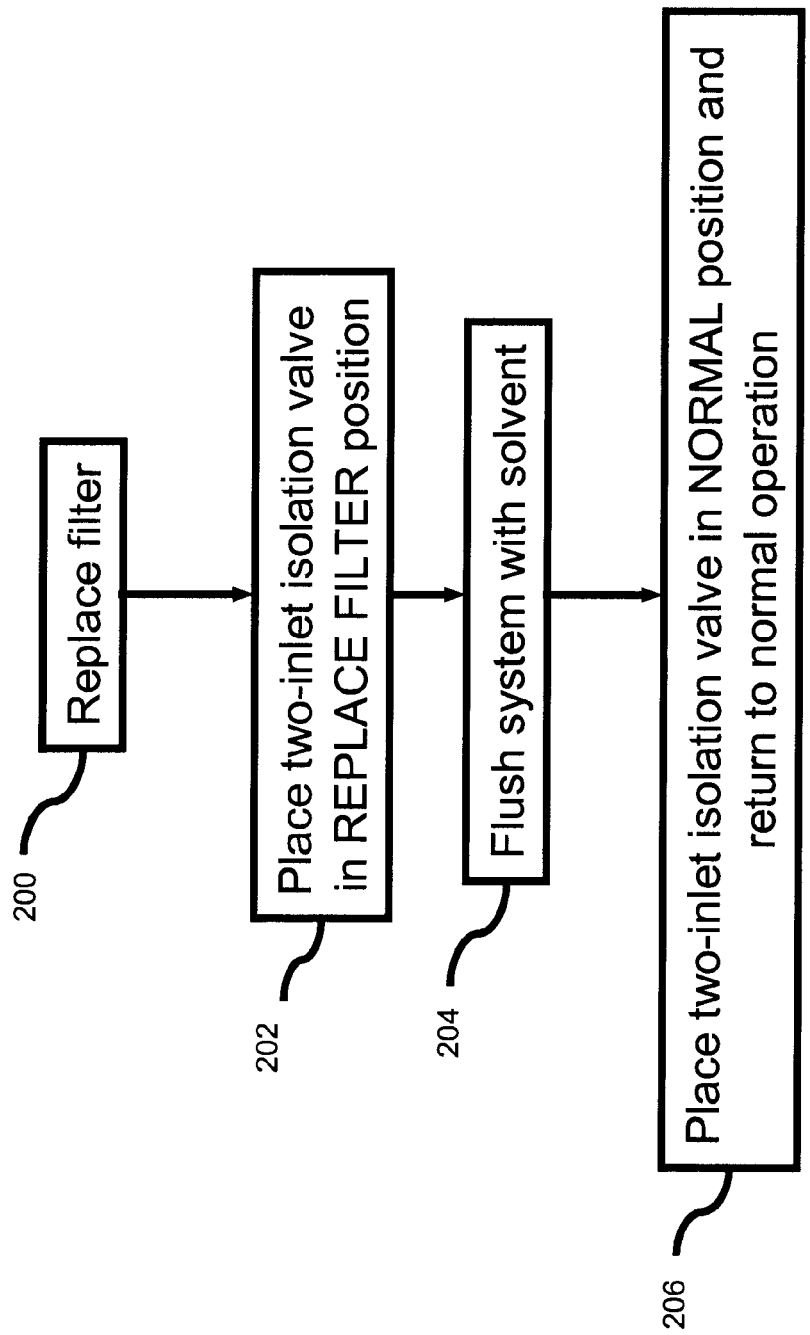
FIG. 2 illustrates a flowchart of implementation of a resist filter replacement technique in a system such as the system of FIG. 1 in accordance with one embodiment.

FIG. 2 is a flowchart of the implementation of a resist filter replacement technique in a system such as the system of FIG. 1 in accordance with one embodiment. It will be assumed that, immediately prior to the time at which the resist filter is replaced, the dispenser portion of the system is functioning in normal operation mode; for example, it is being used to coat wafers with photoresist. Responsive to a determination that the filter needs to be replaced, in step 200, the old filter is replaced with a new filter. In step 202, which should occur substantially contemporaneously with step 200, the two-inlet isolation valve is moved from a first "NORMAL" position, which enables normal operation during which photoresist is supplied to the dispense pump, to a second "REPLACE FILTER" position, in which solvent is flushed through the pipes and filtration system to pre-wet and clean the replacement filter to prepare it for use. Once the filter has been sufficiently pre-wet and cleaned (step 204), the isolation valve is returned to the NORMAL position (step 206), thereby allowing photoresist solution to flow through the system and the dispenser to return to normal operation. It will be recognized that control of the valve position may be implemented manually or automatically, such as under software control.

One embodiment is a system for implementing a resist filter replacement technique, the system comprising a filter connected to a dispenser; and a switch connected to the filter for selectively connecting the filter to throughput one of a first chemical solution and a second chemical solution.

Another embodiment is a method for replacing a resist filter of a filtration system connected to a dispenser. The method comprises replacing the resist filter; connecting the filtration system to throughput a first chemical solution for cleaning and pre-wetting the resist filter; and subsequent to the connecting filtration system to throughput a first chemical solution, connecting the dispenser to receive a second chemical solution.

Yet another embodiment is an apparatus for facilitating replacement of a resist filter of a filtration system connected to a dispenser. The apparatus comprises means for connecting the filtration system to throughput a first chemical solution contemporaneously with replacement of the resist filter, the first chemical solution for cleaning and pre-wetting the resist filter; and means for connecting the dispenser to a second chemical solution subsequent to the connecting filtration system to throughput a first chemical solution.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method for replacing a resist filter of a filtration system connected to a dispenser, the method comprising:
   replacing an old resist filter with a new resist filter;
   subsequent to the replacing, connecting the filtration system to throughput an organic solvent capable of dissolving a photoresist;
   moving a two-inlet isolation valve from a first position to a second position to flush the organic solvent through the new resist filter to clean and pre-wet the new resist filter in the filtration system; and
   subsequent to the connecting the filtration system to throughput the organic solvent, connecting the dispenser to receive a photoresist solution using the two-inlet isolation valve.

2. The method of claim 1 wherein a position of the two-inlet isolation valve is controlled manually.

3. The method of claim 1 wherein a position of the two-inlet isolation valve is controlled via software.

4. The method of claim 1, wherein replacing the new resist filter and connecting the filtration system to throughput the organic solvent occurs substantially contemporaneously.

5. The method of claim 1, further comprising moving the two-inlet isolation valve from the second position to the first position to allow the photoresist solution to flow through the filtration system.

* * * * *